United States Patent
Godfried (10) Patent No.: US 10,082,424 B2
(45) Date of Patent: Sep. 25, 2018

(54) DIAMOND-BASED MONITORING APPARATUS FOR LITHOGRAPHIC APPARATUS, AND A LITHOGRAPHIC APPARATUS COMPRISING DIAMOND-BASED MONITORING APPARATUS

(71) Applicant: ASML Netherlands B.V., Veldhoven (NL)

(72) Inventor: Herman Philip Godfried, Amsterdam (NL)

(73) Assignee: ASML Netherlands B.V., Veldhoven (NL)

( * ) Notice: Subject to any disclaimer, the term of this patent is extended or adjusted under 35 U.S.C. 154(b) by 35 days.

(21) Appl. No.: 15/308,670

(22) PCT Filed: Apr. 21, 2015

(86) PCT No.: PCT/EP2015/058564
§ 371 (c)(1),
(2) Date: Nov. 3, 2016

(87) PCT Pub. No.: WO2015/169581
PCT Pub. Date: Nov. 12, 2015

(65) Prior Publication Data
US 2017/0184451 A1    Jun. 29, 2017

(30) Foreign Application Priority Data
May 7, 2014 (EP) .................................... 14167278

(51) Int. Cl.
G03F 7/20 (2006.01)
G01J 1/58 (2006.01)
G01J 1/42 (2006.01)

(52) U.S. Cl.
CPC ................ *G01J 1/58* (2013.01); *G01J 1/429* (2013.01); *G01J 1/4257* (2013.01);
(Continued)

(58) Field of Classification Search
CPC ............ G03F 7/70341; G03F 7/70141; G03F 7/70191; G03F 7/7085; G03F 7/70883
See application file for complete search history.

(56) References Cited

U.S. PATENT DOCUMENTS 7,213,963 B2    5/2007 Lof et al.
2003/0197849 A1*  10/2003 Ishikawa .............. G03B 27/72
                                                    355/69

(Continued)

FOREIGN PATENT DOCUMENTS

CN        103162848       6/2013
EP        1 426 827       6/2004

(Continued)

OTHER PUBLICATIONS

M.D. Whitfield et al., Diamond photodetectors for next generation 157-nm deep-UV photolithography tools, 2001, Diamond and Related Materials, 10, 693-697.*

(Continued)

*Primary Examiner* — Steven H Whitesell Gordon
(74) *Attorney, Agent, or Firm* — Pillsbury Winthrop Shaw Pittman LLP (57) ABSTRACT

A lithographic apparatus including a monitoring apparatus and an associated monitoring apparatus. The monitoring apparatus is configured for monitoring first radiation of a first wavelength. The monitoring apparatus has a first sensor apparatus including a diamond fluorescent material configured to absorb the first radiation and to emit second radiation being representative of the first radiation, the second radia- (Continued)

tion being of a second wavelength; and a second sensor apparatus configured to sense the second radiation.

21 Claims, 4 Drawing Sheets

(52) U.S. Cl.
CPC ........ *G03F 7/7085* (2013.01); *G03F 7/70558* (2013.01); *G03F 7/70616* (2013.01)

(56) References Cited

U.S. PATENT DOCUMENTS

| | | | |
|---|---|---|---|
| 2005/0264778 A1 | 12/2005 | Lof et al. | |
| 2006/0091328 A1 | 5/2006 | Kanazawa | |
| 2006/0221316 A1* | 10/2006 | Yamamoto | G03F 7/702 355/53 |
| 2007/0081138 A1 | 4/2007 | Kerkhof et al. | |
| 2012/0274911 A1 | 11/2012 | Lof et al. | |
| 2014/0247094 A1* | 9/2014 | Englund | G01R 33/1284 331/94.1 |

FOREIGN PATENT DOCUMENTS

| | | | |
|---|---|---|---|
| TW | 201245902 | 11/2012 | |
| WO | WO 9420837 A1 * | 9/1994 | G01N 21/87 |
| WO | 2012/136420 | 10/2012 | |

OTHER PUBLICATIONS

Robins et al.,Photoluminescence excitation by band-gap optical absorption in chemical vapor deposition diamond films, Mar. 15, 1991, J. Appl. Phys., 69, 3702-3708.*

International Search Report and Written Opinion dated Sep. 7, 2015 in corresponding International Patent Application No. PCT/EP2015/058564.

Romana Schirhagl et al., "Nitrogen-Vacancy Centers in Diamond: Nanoscale Sensors for Physics and Biology," Annu. Rev. Phys. Chem, vol. 65, pp. 83-105 (2014).

Yasuo Koide et al., "Development of Thermally Stable, Solar-Blind Deep-Ultraviolet Diamond Photosensor," Materials Transactions, vol. 46, No. 9, pp. 1965-1968 (2005).

E. Pace et al. "Innovative diamond photo-detectors for UV astrophysics," Mem. S.A.It. Suppl, vol. 14, pp. 84-89 (2010).

Disclosed anonymously, "Sensor for example for a lithography apparatus," Research Disclosure database No. 565007, pp. 1-4 (May 2011).

Rohan Adur, "Using single nitrogen-vacancy centers in diamond nanocrystals for sensitive sensing of weak magnetic fields with nanoscale resolution," Term Paper, The Ohio State University, Department of Physics, 4 pages (circa 2010).

Peo, Promis Electro Optics b.v., http://www.gotoPEO.com/images/stories/08_peo_diamonddetector_advert.jpg, 1 page (undated).

D. Evanko, "Magnetic field imaging and more," Nature Methods, vol. 10, No. 6, p. 468 (Jun. 2013).

* cited by examiner

DIAMOND-BASED MONITORING APPARATUS FOR LITHOGRAPHIC APPARATUS, AND A LITHOGRAPHIC APPARATUS COMPRISING DIAMOND-BASED MONITORING APPARATUS

CROSS-REFERENCE TO RELATED APPLICATIONS

This application is the U.S. national phase entry of PCT patent application no. PCT/EP2015/058564, which was filed on Apr. 21, 2015, which claims the benefit of priority of EP provisional application no. 14167278.2, which was filed on May 7, 2014, and which is incorporated herein in its entirety by reference.

FIELD

The present invention relates to a monitoring apparatus configured for radiation monitoring, and in particular such monitoring apparatuses for use in a lithographic apparatus.

BACKGROUND

A lithographic apparatus is a machine that applies a desired pattern onto a substrate (also referred to as wafer), usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Lithographic apparatuses require one or more sensors for sensing the magnitude of one or more parameters of the lithographic process. These sensors may include spot sensor apparatuses for sensing a dose of radiation received at the level of the substrate and may also include energy sensor apparatuses for sensing the radiation pulse energy. Output of the spot sensor apparatuses may be compared to the output of the energy sensor apparatuses, with the comparison being used for control of the dose of radiation.

SUMMARY

It is desirable to provide improved a sensor apparatus, such as a spot sensor apparatus and/or an energy sensor apparatus, forming part of a monitoring apparatus.

According to an aspect of the invention, there is provided a lithographic apparatus comprising a monitoring apparatus, the monitoring apparatus being configured for monitoring first radiation of a first wavelength; wherein said monitoring apparatus comprises: a first sensor apparatus comprising a diamond fluorescent material configured to absorb the first radiation and to emit second radiation being representative of the first radiation, said second radiation being of a second wavelength; and a second sensor apparatus configured to sense said second radiation.

According to a further aspect of the invention, there is provided a monitoring apparatus configured to monitor first radiation of a first wavelength; wherein said monitoring apparatus comprises: a first sensor apparatus comprising a diamond fluorescent material configured to absorb the first radiation and to emit second radiation being representative of the first radiation, said second radiation being of a second wavelength; and a second sensor apparatus configured to sense said second radiation.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
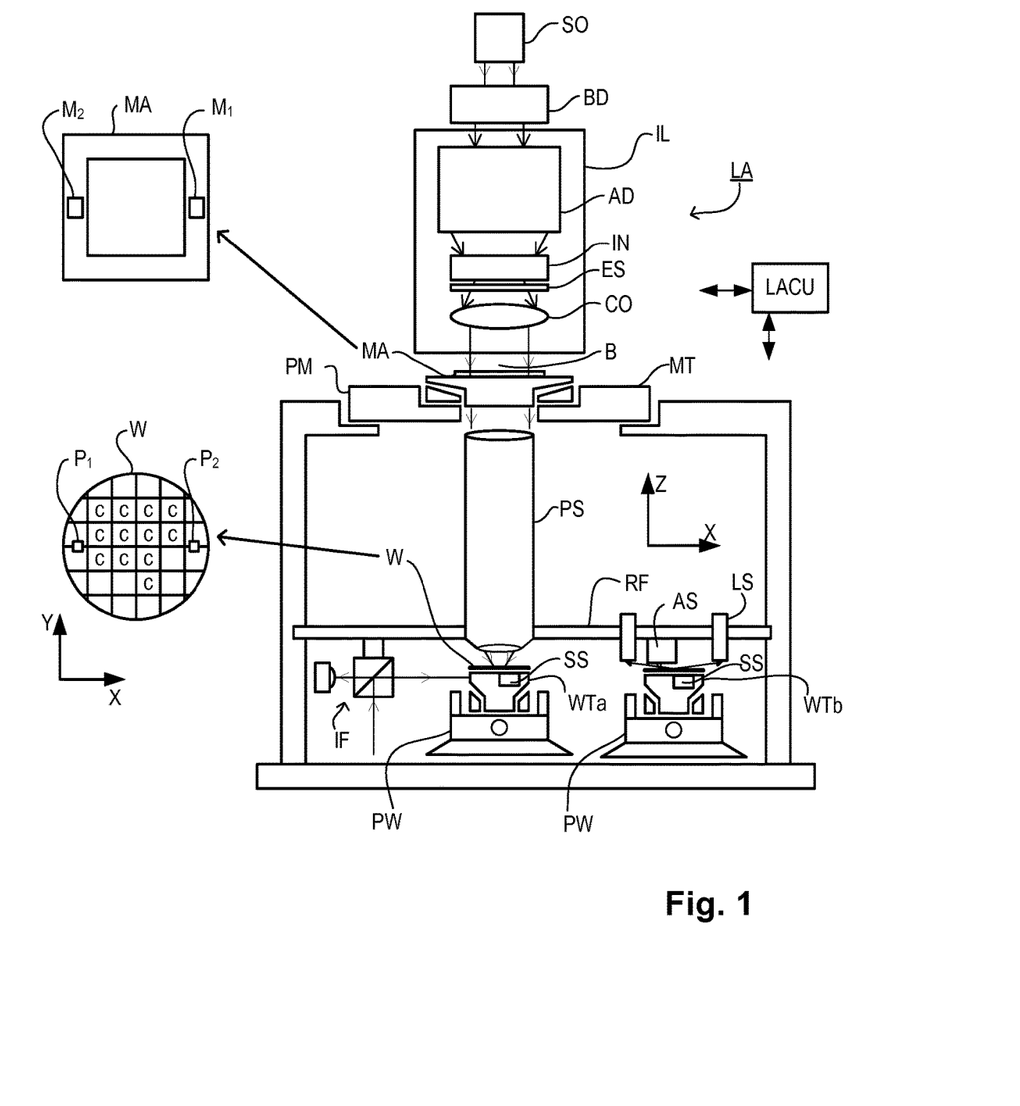
FIG. 1 depicts a lithographic apparatus according to an embodiment of the invention.

FIG. 1 schematically depicts a lithographic apparatus according to one embodiment of the invention. The apparatus comprises:

- an illumination system (illuminator) IL configured to condition a radiation beam B (e.g., UV radiation or DUV radiation).
- a support structure (e.g., a mask table) MT constructed to support a patterning device (e.g., a mask) MA and connected to a first positioner PM configured to accurately position the patterning device in accordance with certain parameters;
- a substrate table (e.g., a wafer table) WT constructed to hold a substrate (e.g., a resist-coated wafer) W and connected to a second positioner PW configured to accurately position the substrate in accordance with the certain parameters and/or in accordance with certain other parameters; and
- a projection system (e.g., a refractive projection lens system) PS configured to project a pattern, imparted to the radiation beam B by patterning device MA, onto a target portion C (e.g., comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT supports the patterning device MA. The support structure MT holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure may comprise a frame or a table, for example, which may be fixed or movable as required. The support structure MT may ensure that the patterning device MA is at a desired position, for example, with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in a cross-section of the radiation beam such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The illuminator IL may include an energy sensor ES. Energy sensor ES forms part of a monitoring apparatus which monitors a reference beam intensity.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

Substrate table WT may include a spot sensor SS, which may be mounted in a position outside the area occupied by the wafer to be exposed. Spot sensor SS is used to provide a dose reference for energy sensor ES during exposures: it has been calibrated against a National Institute of Standards (NIST) traceable detector and by periodically (e.g. between wafer exposures or between lots) moving wafer table WT to a position where the spot sensor SS is illuminated by the DUV or UV light and comparing its reading with the simultaneous reading of the energy sensor ES. It provides a calibration for the energy sensor ES readout in terms of the dose arriving on the wafer table WT. This mechanism thus enables accurate control of the dose arriving on the wafer table WT during exposures.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

To ensure and maintain a high speed, high precision lithographic process, the lithographic apparatus comprises sensor apparatuses, which generate one or more output signals that are used (for example) to calibrate the dose absorbed by the radiation sensitive layer of the substrate. The absolute calibration and time fluctuation of the dose, at wafer level, are critical parameters of the production process. Therefore, before irradiation of the substrate, the setting and history dependent transmission of the projection system may be calibrated by comparing simultaneous outputs of one or more spot sensor apparatuses positioned at substrate level with outputs of one or more energy sensors apparatuses positioned within the illumination or projection system. An energy sensor apparatus is operative to sense the laser pulse energy in the radiation beam. A spot sensor apparatus may be used to measure light intensity of the illumination field at the wafer stage level. Measurements obtained by the spot sensor (which may also be implemented using a photodiode) may be used for dose control.

The one or more spot sensor apparatuses may also be used to calibrate the absolute dose on the wafer for, e.g., transmission monitoring, and to establish the maximum variation of the dose that can be received at a wafer. There may be one or more such spot sensor apparatuses mounted in a wafer stage (or in one or more wafer stages where there is more than one wafer stage).

Since the properties of the dose need to be known with great accuracy, within parts of a percent, the spot sensor apparatuses should be calibrated to a required accuracy which should be maintained during the manufacturing process.

Spot sensor apparatuses may be fluorescence-based sensor apparatuses. Fluorescence-based sensor apparatuses may comprise fluorescent materials, intermediate light transmissive components, optical filters and photodetectors. The basic concept of fluorescence-based sensor apparatuses is for the fluorescent material to absorb radiation from one wavelength or one wavelength region and consequently emit light representative of the absorbed light but at a different wavelength or wavelength region. In particular, such sensor apparatuses may absorb radiation in the ultraviolet region (e.g. deep ultraviolet (DUV) radiation) which is difficult to measure accurately, and emit light in the visible wavelength range which is simpler to measure accurately. The visible radiation can then be collected by, for example, a photodiode. For example, Ce-doped yttrium aluminium garnet (YAG:Ce) crystals may be employed for conversion of the DUV radiation at 193 nm from Argon Fluoride (ArF) lasers to visible radiation. However, YAG:Ce based sensor apparatuses present major drawbacks when employed in lithographic apparatus.

Figure 2:
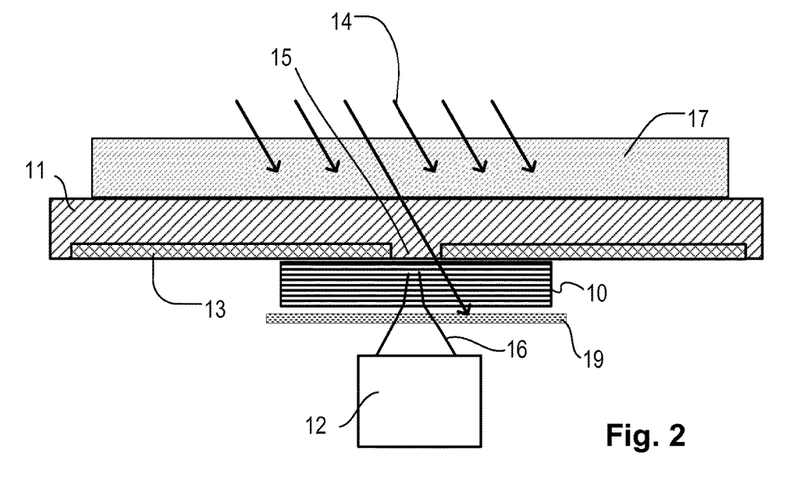
FIG. 2 illustrates a monitoring apparatus for a lithographic apparatus.

FIG. 2 illustrates a monitoring apparatus comprising a known YAG:Ce based sensor apparatus being used in an immersion lithography process. FIG. 2 shows a transmissive plate 11 (e.g. a quartz glass plate) with an opaque shielding, e.g., an opaque coating 13 on one side, the shielding defining an aperture 15. Some of the incident DUV radiation 14, having passed through immersion liquid 17 (e.g. water) and transmissive plate 11, passes through aperture 15 and is absorbed by fluorescent YAG:Ce material 10. The fluorescent YAG:Ce material 10 converts the incident DUV radiation 14 into visible radiation 16 which is sensed by a second sensor apparatus 12, e.g., a photodetector. A DUV filter 19 is provided to block unabsorbed DUV radiation 14.

In immersion lithography one of the surfaces of the transmissive plate 11, transmitting the DUV light 14 to the fluorescent YAG:Ce material 10, may be in contact with the immersion liquid 17. Another surface of the transmissive plate 11 may be in contact with the underlying fluorescent YAG:Ce material 10. Due to the low thermal conductivity of the (e.g. quartz glass) transmissive plate 11, the inherent heating of YAG:Ce crystals causes the fluorescent YAG:Ce material 10 temperature to vary significantly. Therefore, the inherent fluorescence yield of the fluorescent YAG:Ce material 10 is measured to vary by as much as 0.4%/K, leading to a drift of the sensor apparatus sensitivity by up to 1% (depending on the exposure conditions).

Additionally, the absorption coefficient of YAG:Ce crystals when absorbing DUV radiation (e.g. at 193 nm wavelength) is low and the chances of a particular ray being absorbed depends upon its incident angle on the YAG:Ce-based sensor apparatus. Depending on the angle of incidence of the rays, there are rays which traverse a relatively long path in the crystal and thus have a high chance of being absorbed, and generating fluorescence that can be detected, while there are other rays which traverse a relatively short path in the crystal and thus have a lower chance of being absorbed and generating fluorescence. Also, whether the fluorescent light falls onto the second sensor apparatus 12 depends upon the position in the crystal where the fluorescence is generated, which in turn depends upon the incident angle of the DUV light. Consequently, the YAG:Ce-based sensor apparatus may present different sensitivity for different angles of incidence. The angular dependence of a YAG:Ce-based sensor apparatus can be considered during the calibration procedure; however, the temporal variation of the sensitivity of the YAG:Ce-based sensor apparatus (for example, due to heating of the fluorescent material) leads to miscalibration between YAG:Ce based sensor apparatuses positioned at different locations on the manufacturing apparatus. The drift of the sensitivity can only be rectified by exhaustive and time-consuming calibration procedures.

Lithographic apparatus employing YAG:Ce based sensor apparatuses are described, for example, in the patent application US 2012/0274911 A1, which is incorporated herein by reference.

FIGS. 3 to 7 depict schematically embodiments of a monitoring apparatus, each of which comprises a first sensor apparatus having a diamond fluorescent material arranged in a 'spot sensor' configuration. The monitoring apparatus may be positioned at substrate level, in an immersion lithographic apparatus. The monitoring apparatus relies on the material properties of diamond to overcome some of the issues of known fluorescence based monitoring apparatuses.

Diamond possesses the highest heat conductivity of all solid materials, leading to a rapid diffusion of the heat load, caused by absorption of radiation, inside the diamond crystal. Furthermore, the diamond fluorescent material has a wide bandgap, the energy of which corresponds to the energy of photons with a wavelength of 220 nm, and therefore absorbs DUV radiation (having wavelengths shorter than 220 nm, in particular 193 nm for an ArF laser) in a layer immediately below the exposed surface having a thickness of the order of 1 μm. Due to extreme radiation hardness, the diamond fluorescent material can be used, for example, for particle detection.

There are a large number of electromagnetic actuators in a lithographic apparatus, which give rise to electromagnetic radiation and therefore magnetic fields within the monitoring apparatus environment. Furthermore, there are a number of published documents which propose that the fluorescence of diamond is dependent upon the strength of magnetic fields in the vicinity. These publications include Adur, R "*Using single nitrogen-vacancy centers in diamond nanocrystals for sensitive sensing of weak magnetic fields with nanoscale resolution*", Term Paper, circa 2010, Ohio State University, Department of Physics; and Evanko, D. "*Magnetic imaging and more*"; Nature Methods Vol. 10, No. 6, p. 468 (2013).

If the operation of a monitoring apparatus, using a diamond fluorescent material, were to be noticeably affected by the electromagnetic fields present in a lithographic machine, the monitoring apparatus could not be used in such an environment. However, the inventor has determined that these articles discuss absorption which takes place in the nitrogen-vacancy (NV) color centers, at energies which are below the bandgap of diamond, while the DUV radiation absorbed by monitoring apparatuses in the applications proposed herein has photon energies above the bandgap. Therefore the inventor has surmised that the main absorption should take place by direct, above-bandgap absorption, and if there is any effect (since the NV-centers will also absorb), the effect will be small.

One or more of several diamond materials may be used as the diamond fluorescent material for the monitoring apparatuses disclosed herein. These diamond materials are, for example:

(1) Monocrystalline synthetic CVD (chemical vapor deposition) material: an intrinsic CVD grown single crystal material, with properties comparable to the natural type IIa diamond and low levels of nitrogen impurities;

(2) Polycrystalline equivalent of (1): optical grade synthetic poly-CVD diamond;

(3) Natural type IIa single crystal material;

(4) Mono-crystalline synthetic high pressure, high temperature (HPHT) grown diamond of type Ib—this has a higher levels of nitrogen impurities than the monocrystalline synthetic CVD material (1) and is yellowish to brownish colored;

(5) Polycrystalline thermal grade poly-CVD diamond: a synthetic poly-CVD which has a high density of scattering and absorbing imperfections in the material resulting in a nearly opaque, optically black material. However it still transmits light when sufficiently thin that the total number of scattering and absorbing sites in the line of sight through the material is small.

(6) B-doped synthetic polycrystalline CVD material;

(7) Natural type IIb (B-doped) single crystal diamond.

In preferred embodiments, diamond fluorescent materials (1) and (2) are employed, respectively.

Figure 3:
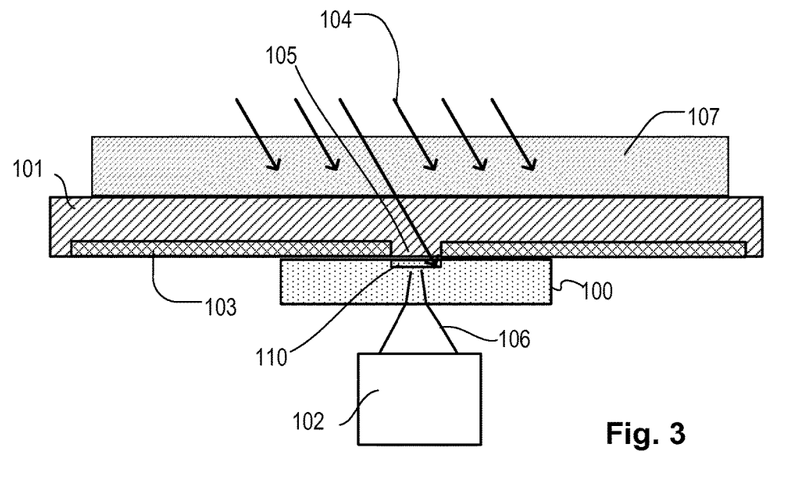
FIG. 3 illustrates a monitoring apparatus according to a first embodiment of the present invention.

FIG. 3 shows a monitoring apparatus comprising a first sensor apparatus having diamond fluorescent material 100, which is otherwise similar in structure to the known sensor apparatus of FIG. 2. It shows a transmissive plate 101 (e.g. a quartz glass plate) with opaque shielding, e.g., a coating 103, on one side defining an aperture 105. Some incident DUV radiation 104, passes through immersion liquid 107 (e.g. water), transmissive plate 101, and aperture 105 and is absorbed by diamond fluorescent material 100. The diamond fluorescent material 100 converts the absorbed DUV radiation 104 into visible radiation 106 which is detected by a second sensor apparatus (e.g., photodetector or photodiode) 102. No filters are required between the diamond fluorescent material 100 and the second sensor apparatus 102 to suppress any residual DUV radiation 104 reaching the second sensor apparatus 102, as the DUV radiation 104 is absorbed in the uppermost few microns 110 of the diamond fluorescent material 100.

Figure 4:
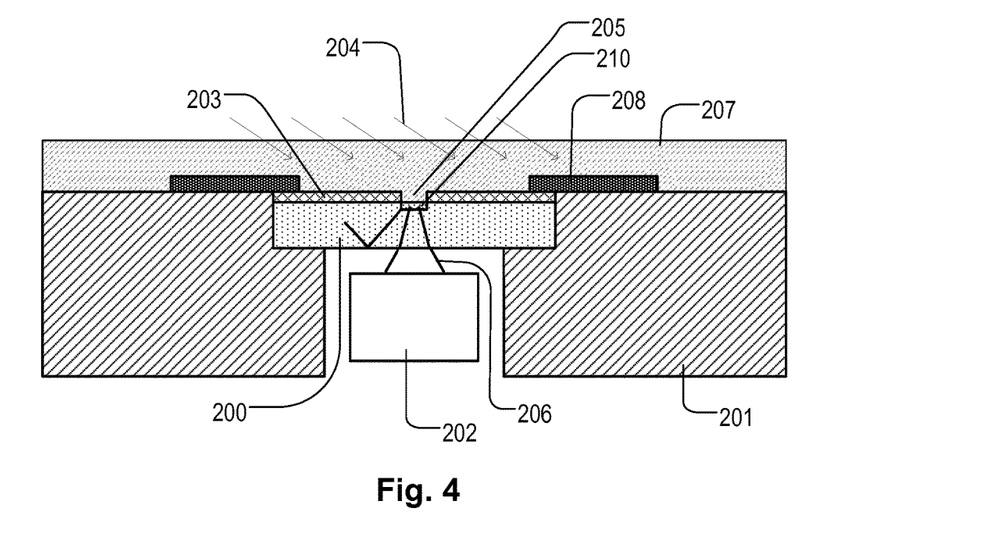
FIG. 4 illustrates a monitoring apparatus according to a second embodiment of the present invention.

FIG. 4 shows a further embodiment of monitoring apparatus comprising a first sensor apparatus having diamond fluorescent material 200. This further embodiment has improved heat stability when compared to the embodiment of FIG. 3, due to the diamond fluorescent material 200 being in contact with immersion liquid 207. FIG. 4 shows the diamond fluorescent material 200, a holder 201 and a photodiode 202. The diamond fluorescent material 200 comprises an opaque coating 203 deposited on the irradiated surface of the diamond fluorescent material 200; the opaque coating 203 having a circular aperture 205. The opaque coating 203 delimits the area of the diamond fluorescent material 200 which is exposed to DUV radiation 204 that has passed through the aperture 205. The diamond fluorescent material 200 converts the absorbed DUV radiation 204 into visible radiation 206, which is sensed by a second sensor apparatus 202, e.g., a photodetector, situated underneath the material. As before, the DUV radiation 204 is absorbed in the uppermost few microns 210 of the diamond fluorescent material 200.

The holder 201 may be made of metal, for example stainless steel. The holder 201 adapts the shape/size of the diamond fluorescent material 200 to the shape/size of a housing for the monitoring apparatus. The housing for the monitoring apparatus may be, for example, of circular shape and have a diameter in the region of 50-100 mm. The diamond fluorescent material 200 may be inserted into a recessed shoulder in the holder 201. The diamond fluorescent material 200 may be brazed or glued into the holder 201. The upper surface 210 of the diamond fluorescent material 200 is exposed to the radiation 204 and is in contact with an immersion liquid 207. This upper surface 210 of the diamond fluorescent material 200 can be higher, lower or coplanar with the upper surface of the holder 201, depending on the immersion system requirements. The diamond fluorescent material 200 may be mounted in the holder 210 with a step height less than or of the order of several microns.

The gap between the diamond fluorescent material 200 and the holder 201 may be covered by a coated or uncoated protective layer 208. The protective layer 208 may be any shape, size or thickness. For example, the protective layer 208 may be of annular shape with an inner diameter of the order of 2 mm. The protective layer 208 is also in contact with the immersion liquid 207 and exposed to DUV radiation 204. The protective layer 208 may, for example, comprise a thin foil made from stainless steel in an annular shape. A hydrophobic coating for protective layer 208 is desirable such that no water film is left behind, which can subsequently evaporate and cool down the surface of the detector, affecting the thermal stability of the wafer table WT and silicon wafer (which impacts on overlay, i.e., layer to layer registration). However, such a coating should comprise a hydrophobic material which does not quickly lose its hydrophobic character when exposed to UV radiation.

The diameter of the aperture 205 may be, for example, between 10 µm to 500 µm, between 50 µm to 200 µm or between 100 µm to 150 µm. The opaque coating 203 may comprise a metal coating or metallization. In an embodiment, the opaque coating 203 may be composed of a certain type of carbidizing (i.e. carbide forming) metal forming chemically stable, mechanically strong bonds with the diamond fluorescent material 200. For example, titanium, tungsten, tantalum, and chromium may be used. Note that the chemical corrosion of the opaque coating 203, being in contact with the immersion liquid 207, may limit the lifetime of the apparatus.

An advantage of this arrangement over that depicted in FIG. 3 is that, as the irradiated upper surface of the first sensor apparatus is in contact with the immersion liquid 207, the heat load generated by absorption of DUV radiation 204 can be immediately carried off by the immersion liquid 207 at the exposed region 210 of the diamond fluorescent material 200. Due to the high thermal conductivity of the diamond fluorescent material 200, the heat is effectively diffused over the area where the diamond fluorescent material 200 is in contact with the immersion liquid 207. Therefore, the temperature rise of the diamond fluorescent material 200 is significantly reduced between subsequent irradiations (i.e. laser pulses or bursts of laser pulses), reducing the sensitivity drift of the monitoring apparatus.

Figure 5:
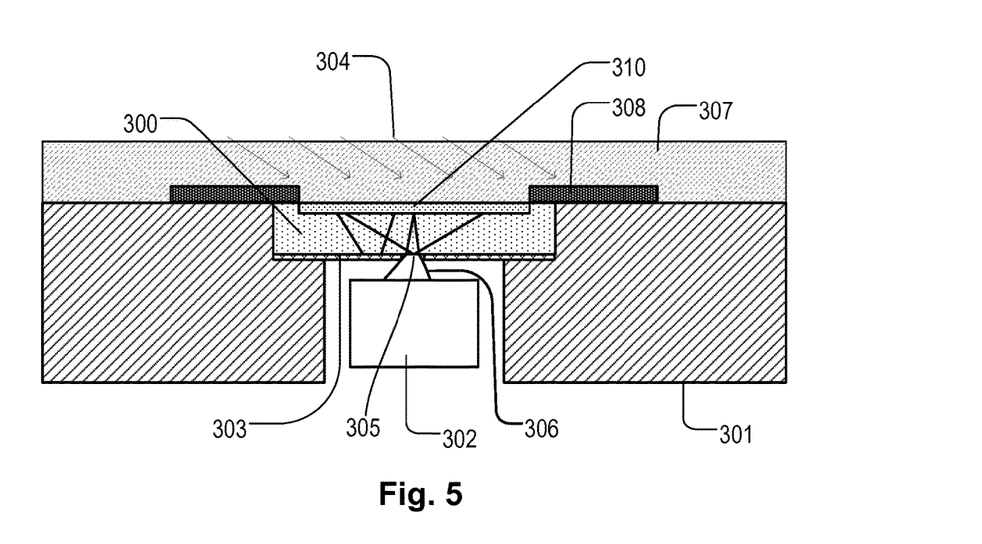
FIG. 5 illustrates a monitoring apparatus according to a third embodiment of the present invention.

FIG. 5 shows a monitoring apparatus which is similar to that depicted in FIG. 4. As before, the figure shows a first sensor apparatus comprising diamond fluorescent material 300 within a holder 301 with a protective layer 308, and an immersion liquid 307. However, in this embodiment, the opaque coating 303 with aperture 305 is now deposited on the lower surface of a diamond fluorescent material 300 (i.e. the surface facing a second sensor apparatus 302). As before, DUV radiation 304 is absorbed in the uppermost few microns 310 of the diamond fluorescent material 300. Due to the high refractive index of diamond fluorescent material (2.4 at visible wavelengths), only the visible radiation 306 incident on the lower surface of the diamond fluorescent material 300 that originates from within a cone having a half angle of the order of 22° (with respect to the normal to the surface) can exit through the aperture 305. All visible radiation 306 incident on the aperture 305, originating from outside this cone would be totally internally reflected. In addition multiple reflections of fluorescent light inside the diamond fluorescent material 300 will not occur since the carbide interface layer between the diamond fluorescent material 300 and the opaque coating 303 (comprising, e.g., Ti) is essentially black and absorbs the light incident on it. Therefore, a large portion of the incident DUV radiation 304 is internally reflected at the aperture 305 or absorbed at the diamond-metal carbide interface layer.

Consequently, only radiation which originates from the region directly above aperture 305 can exit the diamond fluorescent material 300.

The diamond fluorescent material 200, 300 of either of the FIG. 4 and FIG. 5 embodiments may comprise any shape, size or thickness. It may be coated or uncoated. In one example diamond fluorescent material 200, 300 may have a thickness smaller than 0.5 mm, and more preferably smaller than 0.2 mm. The diamond fluorescent material 200, 300 may be any shape, preferably circular to facilitate mounting in the holder 201, 301. The diamond fluorescent material 200, 300 surfaces may be polished on its side or cut out with a laser. The latter is preferred, if the diamond fluorescent material 200, 300 is glued into the holder 201, 301, due to the better grip of the adhesive on rough surfaces. Where single crystal diamond fluorescent material 200, 300 is employed, the material orientation may be chosen to minimize production costs.

Figure 6:
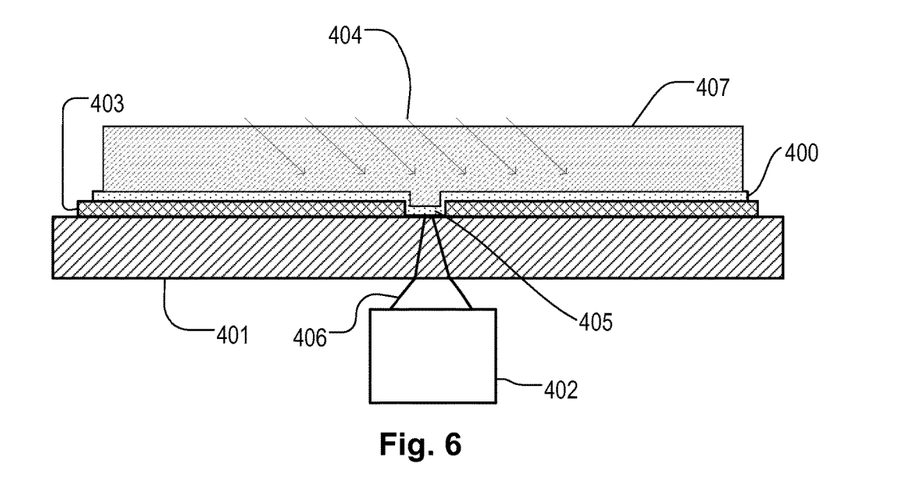
FIG. 6 illustrates a monitoring apparatus according to a fourth embodiment of the present invention.

FIG. 6 depicts another embodiment of the monitoring apparatus, in a spot sensor apparatus configuration, employed in an immersion lithographic apparatus. The monitoring apparatus comprises a first sensor apparatus which may be positioned at substrate level. The first sensor apparatus comprises a transmissive substrate 401, which may be for example quartz glass, onto which has been deposited a metal coating 403 with circular aperture 405 and on top of this, a layer of diamond fluorescent material 400. As before, the monitoring apparatus comprises a second sensor apparatus 402, such as a photodetector. The layer of diamond fluorescent material 400 is in contact with an immersion liquid 407 and the whole layer is irradiated by DUV radiation 404. The second sensor apparatus 402 is positioned underneath the transmissive substrate 401, and senses the visible radiation 406 emitted by the diamond fluorescent material 400. Opaque coating 403 and aperture 405 may comprise the same or similar properties and dimensions as the corresponding elements of FIGS. 2 and 3.

The diamond fluorescent material 400 may comprise (for example) polycrystalline CVD diamond having a thickness of less than 5 µm, more preferably 1-2 µm. Particularly advantageously, the diamond fluorescent material 400 can be made hydrophobic by hydrogen plasma etching. The etching produces a hydrogen terminated surface which is hydrophobic due to the absence of strong dipole moments. As the carbon-hydrogen bond energy is greater than DUV photon energies, the hydrophobic properties of the material should be DUV resistant and stable over time. Since the diamond fluorescent material 400, made hydrophobic in this way, is in contact with the immersion liquid 407, the heat generated in the layer may be transported away by the liquid.

A silicon wafer or metal substrate, for instance a tungsten substrate, can be employed instead of the transmissive substrate 401 with opaque coating 403. An aperture can be made in the silicon wafer or metal substrate by means of etching or spark erosion. Where a metal substrate is employed, the aperture 405 may be partially formed by mechanical means (for example, may be drilled). If a silicon wafer or metal substrate is used, the diamond fluorescent material 400 may be of the order of 10 to 20 μm in thickness to be freestanding and to be able to support the pressure of immersion liquid 407 at the aperture 405.

Figure 7:
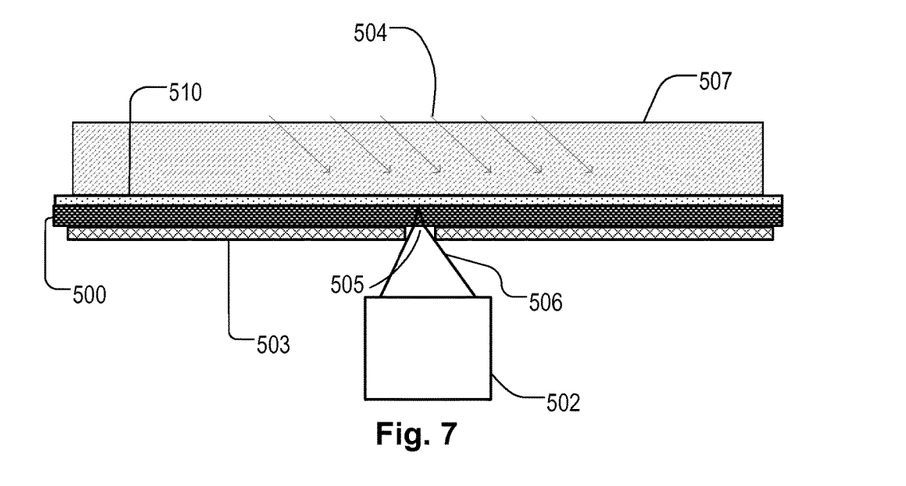
FIG. 7 illustrates a monitoring apparatus according to a fifth embodiment of the present invention.

FIG. 7 depicts a similar embodiment of the monitoring apparatus to that depicted in FIG. 6. In this embodiment, a plate of thermal grade diamond fluorescent material 500 is used as the fluorescent material. This is significantly less expensive than the clear optical grade diamond fluorescent material used in other embodiments. Thermal grade diamond fluorescent material normally appears black due to a high rate of scattering inside the material at the grain boundaries and to the inclusion of non-diamond carbon at these boundaries. However, a sufficiently thin layer of thermal grade diamond fluorescent material 500, for example thinner than 0.2 mm, may be partially transparent to light produced by fluorescence 506 due to the limited number of scattering sites in the direction perpendicular to the diamond fluorescent material 500. The size and shape of thermal grade diamond fluorescent material 500 may be engineered to match the first sensor apparatus housing shape and dimension. For example, the thermal grade diamond fluorescent material 500 may be circular with a diameter of the order of 50 mm-100 mm. An opaque coating 503 may be applied on the lower surface of the diamond fluorescent material 500, having an aperture 505. Aperture 505 may be of the order of 120 μm in diameter (or any of the ranges disclosed in relation to other embodiments). The upper surface 510 of the diamond fluorescent material 500 (which is exposed to DUV radiation 504 via immersion liquid 507) may be made hydrophobic by selecting the surface termination as described in relation to FIG. 6. Visible radiation 506 exiting the diamond fluorescent material 500 though the aperture 505, toward the second sensor apparatus 502, e.g. photodetector, is restricted to rays incident upon the aperture at small angles with respect to normal. Residual radiation may be lost due to reflection, scattering and absorption in the multilayered material. As the diamond fluorescent material 500 is in contact with the immersion liquid 507, the heat generated in the layer of diamond fluorescent material 500 is carried off by the immersion liquid 507.

Diamond as a fluorescent material can also be utilized in sensor apparatuses operating in a 'slit' sensor apparatus configuration. All embodiments described herein may be suitably amended in this manner. A slit sensor apparatus may be designed by forming an elongate or slit shaped opening in the opaque coating 203, 303, 403, 503 instead of the circular aperture 205, 305, 405, 505 of the first sensor apparatuses up to now described. As before, the opaque coating 203, 303, 403, 503 can be deposited on the upper or lower surfaces of the diamond fluorescent material 200, 300, 400, 500 or the transmissive substrate 401, depending on the arrangement. It may be that single crystal CVD diamond fluorescent materials are too difficult to manufacture at sizes sufficient to enable the formation of slits of, for instance, 6 mm in length. This limitation may be overcome by the use of polycrystalline diamond fluorescent materials, easily produced with diameters larger than 10 mm. The visible radiation may be detected by a second sensor apparatus having a larger detection area than the second sensor apparatus currently used in spot sensor apparatus. Alternatively, because the DUV light is absorbed in a thin layer at the diamond fluorescent material irradiated surface, the local material fluorescence is proportional to the local intensity of the DUV light. Therefore, sensor arrays may be employed as the second sensor apparatus to measure the incident radiation intensity as a function of position over the length of the slit.

The use of diamond as a fluorescent material can also be utilized in monitoring apparatus for monitoring extreme ultraviolet (EUV) radiation in a 'dry' lithographic apparatus. Due to the absence of the immersion hood there are some distinctions: the hydrophobic properties of diamond would not be important but all of the other properties mentioned remain so. Also the desirability of mounting a diamond fluorescent material flush with its surrounding holder is reduced, as is the need for a protective layer over the gap between the diamond fluorescent material and holder.

Without the cooling effect of the immersion hood, heat sinking the diamond for stable performance may be desirable. Since flush mounting is not so important, one heat sinking method may comprise brazing a polycrystalline diamond fluorescent material on top of a temperature regulated annular holder (e.g. which may comprise tungsten). The diamond fluorescent material would have a spot shaped or slit-shaped aperture formed by an opaque coating on the diamond fluorescent material. The aperture would allow the fluorescent light through to a second sensor.

Note that this arrangement may also be employed for 'dry'-DUV sensor apparatuses, such as 'dry' ArF sensor apparatuses (i.e. for 'dry' DUV lithography at 193 nm wavelength). The sensor apparatus may be connected to a temperature regulated heat sink to control the temperature of the diamond fluorescent material. This means that the high heat conductivity of diamond could be better exploited in ensuring stable performance of the detector.

By selecting diamond fluorescent materials doped with a high level of nitrogen atoms (e.g. Ib type High Pressure, High Temperature (HPHT) diamond), diamond fluorescent materials may be used for conversion of Krypton Fluoride (KrF) radiation (at 248 nm wavelength). If large plates of diamond fluorescent material are required, low level B-doped polycrystalline diamond may be employed. However, this material may be too expensive for industrial use.

Furthermore, diamond fluorescent materials can be employed as fluorescent material in an energy sensor apparatus. It is known to use titanium doped sapphire (Ti:sapphire) as a fluorescent medium in energy sensor apparatuses. However obtaining Ti:sapphire materials with sufficient fluorescence yield and temporal stability can be a problem. In particular, the sensitivity of these Ti:sapphire based energy sensor apparatuses can drift when switching the polarization of the incident light (going from x-pol to y-pol and vice versa). The issue may only be partially overcome by using depolarizers or by stacking plates of Ti:Sapphire with alternating orientations. Diamond fluorescent material should not suffer from this issue because the incident radiation is converted in a thin surface layer of the order of 1 μm in thickness. Note that, as the light beam monitored by the energy sensor apparatus is large, the use of polycrystalline CVD material is most practical. Cooling is important but should not present a problem because of the high heat conductivity of diamond.

The high hardness and erosion resistance of the diamond fluorescent material provides a robust and temporally stable diamond sensor apparatus over the monitor apparatus lifetime, with a fluorescence sensitivity which is constant and independent of the dose which the diamond fluorescent material is exposed to. In addition, the material can be easily cleaned in case of contamination. Also, a consequence of the material hardness is the high Debye temperature which results in a near absence of phonon-phonon scattering and lattice interactions with electronic excitations. This means that the diamond fluorescent material response to DUV radiation is close to linear.

Since the reflection of the DUV radiation at the immersion liquid-diamond fluorescent material interface determines the amount of light coupled into the diamond fluorescent material, and the DUV radiation is absorbed in the uppermost few microns of the diamond surface, the setting dependence of the sensor apparatus sensitivity is entirely determined by angles of incidence and polarization of the incident radiation. Therefore exhaustive calibration of the relative sensitivity, as expressed by the pupil dependent sensitivity matching factor (PSMF) is not necessary. The sensitivity dependence on the incident angle and the polarization may be calculated off-line for any pupil-setting by integrating over the intensities in the pupil, with appropriate weight factors determined from theory for Fresnel reflection.

When diamond coated glass or thermal grade diamond fluorescent materials are employed in sensor apparatus, absorption of radiation outside of the aperture of the opaque coating reduces significantly the stray light in comparison to that of $SiO_2$ spot sensor apparatuses. Therefore, measurements involving spot sensor apparatuses are significantly easier and more accurate.

While the above embodiments are described in terms of conversion of DUV radiation to visible radiation, this is for illustration only and the concepts disclosed herein are not so limited. Conversion of a first radiation having a wavelength outside of the DUV (or even UV) range is within the scope of the invention. Similarly, following conversion of the first radiation to a second radiation, said second radiation may have a wavelength outside of the visible region.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described.

The descriptions above are intended to be illustrative, not limiting. Thus, it will be apparent to one skilled in the art that modifications may be made to the invention as described without departing from the scope of the claims set out below. Other aspects of the invention are set out as in the following numbered clauses:

1. A lithographic apparatus comprising a monitoring apparatus, the monitoring apparatus being configured for monitoring first radiation of a first wavelength; wherein said monitoring apparatus comprises:
a first sensor apparatus comprising a diamond fluorescent material configured to absorb the first radiation and to emit second radiation being representative of the first radiation, said second radiation being of a second wavelength different from said first wavelength; and
a second sensor apparatus configured to sense said second radiation.

2. A lithographic apparatus as in clause 1 wherein said first wavelength is shorter than the second wavelength.

3. A lithographic apparatus as in clause 1 or 2 wherein the first wavelength lies within a first wavelength range representative of ultraviolet radiation, and wherein the second wavelength lies within a second wavelength range representative of visible light.

4. A lithographic apparatus as in any preceding clause wherein said first sensor apparatus comprises an opaque coating presenting an aperture through which said first radiation passes prior to absorption by the diamond fluorescent material or said second radiation passes prior to sensing by said second sensor apparatus.

5. A lithographic apparatus as in clause 4 wherein the opaque coating comprises a metal opaque coating.

6. A lithographic apparatus as in clause 4 or 5 wherein the aperture is a circular.

7. A lithographic apparatus as in clause 6 wherein the aperture diameter is between 50 μm to 200 μm.

8. A lithographic apparatus as in clause 4 or 5 wherein the aperture is elongate.

9. A lithographic apparatus as in clause 8 wherein the elongate aperture is less than 10 mm in length.

10. A lithographic apparatus as in clause 8 or 9 wherein said second sensor apparatus comprises a sensor array operable to sense intensity of said second radiation as a function of position over the length of the elongate aperture.

11. A lithographic apparatus as in any of clauses 4 to 10 wherein the opaque coating is deposited on the upper surface of said diamond fluorescent material.

12. A lithographic apparatus as in any of clauses 4 to 10 wherein the opaque coating is deposited on the lower surface of said diamond fluorescent material.

13. A lithographic apparatus as in any of clauses 4 to 10 wherein the opaque coating is deposited on a transmissive substrate, said diamond fluorescent material being deposited upon said coating.

14. A lithographic apparatus as in clause 13 wherein the transmissive substrate comprises quartz glass.

15. A lithographic apparatus as in any preceding clause wherein said lithographic apparatus is an immersion lithographic apparatus and said first sensor apparatus is operable to be in contact with an immersion liquid.

16. A lithographic apparatus as in clause 15 comprising said diamond fluorescent material comprises a hydrophobic surface operable to be in contact with said immersion liquid in use.

17. A lithographic apparatus as in clause 16 wherein said diamond fluorescent material comprises a hydrogen terminated surface.

18. A lithographic apparatus as in clause 17 wherein said hydrogen terminated surface has been formed by an etching process in hydrogen plasma.

19. A lithographic apparatus as in any of clauses 1 to 14 wherein said lithographic apparatus is not an immersion lithographic apparatus, said first sensor apparatus being operable within a dry environment, and wherein said monitoring apparatus comprises a heat sink.

20. A lithographic apparatus as in any preceding clause wherein said diamond fluorescent material is less than 5 μm thick.

21. A lithographic apparatus as in any preceding clause wherein said diamond fluorescent material is a monocrystalline synthetic CVD material.

22. A lithographic apparatus as in any of clauses 1 to 20 wherein said diamond fluorescent material is an optical grade synthetic poly-CVD diamond.

23. A lithographic apparatus as in any of clauses 1 to 20 wherein said diamond fluorescent material comprises a thermal grade diamond fluorescent material.

24. A lithographic apparatus as in clause 23 wherein said thermal grade diamond fluorescent material has a thickness less than 0.2 mm.

25. A lithographic apparatus as in any preceding clause wherein said monitoring apparatus comprises a holder to support said diamond fluorescent material.

26. A lithographic apparatus as in clause 25 wherein said diamond fluorescent material has a diameter smaller than 10 mm.

27. A lithographic apparatus as in any preceding clause wherein said diamond fluorescent material is a diamond fluorescent material doped with a high level of nitrogen atoms for detection of first radiation having a wavelength greater than 220 nm.

28. A lithographic apparatus as in any preceding clause further comprising:
an illumination system configured to condition a radiation beam;
a projection system configured to project the patterned radiation beam onto a target portion of the substrate; and
a substrate table constructed to hold a substrate.

29. A lithographic apparatus as in clause 28 wherein the monitoring apparatus is operable to measure a parameter of said radiation beam at said substrate table.

30. A lithographic apparatus as in clause 29 wherein said parameter is indicative of the dose levels at said substrate table resultant from said radiation beam.

31. A lithographic apparatus as in any of clauses 28 to 30 wherein the monitoring apparatus is operable to measure a parameter of said radiation beam inside the illumination system or projection system.

32. A lithographic apparatus as in clause 31 wherein said parameter is the energy of said radiation beam.

33. A lithographic apparatus as in any preceding clause comprising a support constructed to support a patterning device, the patterning device being capable of imparting the radiation beam with a pattern in its cross-section to form a patterned radiation beam.

34. A monitoring apparatus configured to monitor first radiation of a first wavelength; wherein said monitoring apparatus comprises:
a first sensor apparatus comprising a diamond fluorescent material configured to absorb the first radiation and to emit second radiation being representative of the first radiation, said second radiation being of a second wavelength different from said first wavelength; and
a second sensor apparatus configured to sense said second radiation.

35. A monitoring apparatus as in clause 34 wherein said first wavelength is within the ultraviolet region and/or a region of shorter wavelength.

36. A monitoring apparatus as in clause 34 or 35 wherein the second wavelength is within the visible region, and/or a region of longer wavelength.

37. A monitoring apparatus as in any of clauses 34 to 36 wherein said first sensor apparatus comprises a opaque coating presenting an aperture through which said first radiation passes prior to absorption by the diamond fluorescent material or said second radiation passes prior to sensing by said second sensor apparatus.

38. A monitoring apparatus as in clause 37 wherein the opaque coating is a metal opaque coating.

39. A monitoring apparatus as in clause 37 or 38 wherein the aperture is a circular.

40. A monitoring apparatus as in clause 39 wherein the aperture diameter is between 50 μm to 200 μm.

41. A monitoring apparatus as in clause 37 or 38 wherein the aperture is elongate.

42. A monitoring apparatus as in clause 41 wherein the elongate aperture is less than 10 mm in length.

43. A monitoring apparatus as in clause 41 or 42 wherein said second sensor apparatus comprises a sensor array operable to measure intensity of said second radiation as a function of position over the length of the elongate aperture.

44. A monitoring apparatus as in any of clauses 37 to 43 wherein the opaque coating is deposited on the upper surface of said diamond fluorescent material.

45. A monitoring apparatus as in any of clauses 37 to 43 wherein the opaque coating is deposited on the lower surface of said diamond fluorescent material.

46. A monitoring apparatus as in any of clauses 37 to 43 wherein the opaque coating is deposited on a transmissive substrate, said diamond fluorescent material being deposited upon said coating.

47. A monitoring apparatus as in clause 46 wherein the transmissive substrate comprises quartz glass.

48. A monitoring apparatus as in any of clauses 34 to 47 wherein said first sensor apparatus is operable to be in contact with an immersion liquid, in use.

49. A monitoring apparatus as in clause 48 comprising said diamond fluorescent material comprises a hydrophobic surface operable to be in contact with said immersion liquid in use.

50. A monitoring apparatus as in clause 49 wherein said diamond fluorescent material comprises a hydrogen terminated surface.

51. A monitoring apparatus as in clause 50 wherein said hydrogen terminated surface has been formed by an etching process in hydrogen plasma.

52. A monitoring apparatus as in any of clauses 34 to 47 wherein said first sensor apparatus is operable within a dry environment, and wherein said monitoring apparatus comprises a heat sink.

53. A monitoring apparatus as in any of clauses 34 to 52 wherein said diamond fluorescent material is less than 5 μm thick.

54. A monitoring apparatus as in any of clauses 34 to 53 wherein said diamond fluorescent material is a monocrystalline synthetic CVD material.

55. A monitoring apparatus as in any of clauses 34 to 53 wherein said diamond fluorescent material is an optical grade synthetic poly-CVD diamond.

56. A monitoring apparatus as in any of clauses 34 to 53 wherein said diamond fluorescent material comprises a thermal grade diamond fluorescent material.

57. A monitoring apparatus as in clause 56 wherein said thermal grade diamond fluorescent material has a thickness less than 0.2 mm.

58. A monitoring apparatus as in any of clauses 34 to 57 comprising a holder to support said diamond fluorescent material.

59. A monitoring apparatus as in clause 58 wherein said diamond fluorescent material has a diameter smaller than 10 mm.

60. A monitoring apparatus as in any of clauses 34 to 59 wherein said diamond fluorescent material is a diamond fluorescent material doped with a high level of nitrogen atoms for detection of first radiation having a wavelength greater than 220 nm.

The invention claimed is:

1. A lithographic apparatus comprising a monitoring apparatus, the monitoring apparatus configured to monitor first radiation of a first wavelength, wherein the monitoring apparatus comprises:
   a first sensor apparatus comprising a diamond fluorescent material configured to absorb the first radiation and to emit second radiation being representative of the first radiation, the second radiation being of a second wavelength different from the first wavelength; and
   a second sensor apparatus configured to sense the second radiation.

2. The lithographic apparatus of claim 1, wherein the first wavelength is shorter than the second wavelength.

3. The lithographic apparatus of claim 1, wherein the first wavelength lies within a first wavelength range representative of ultraviolet radiation, and wherein the second wavelength lies within a second wavelength range representative of visible light.

4. The lithographic apparatus of claim 1, wherein the first sensor apparatus comprises an opaque coating presenting an aperture through which the first radiation passes prior to absorption by the diamond fluorescent material or through which the second radiation passes prior to sensing by the second sensor apparatus.

5. The lithographic apparatus of claim 4, wherein the second sensor apparatus comprises a sensor array operable to sense intensity of the second radiation as a function of position over the length of the aperture.

6. The lithographic apparatus of claim 1, wherein the diamond fluorescent material is a diamond fluorescent material doped with nitrogen atoms for detection of first radiation having a wavelength greater than 220 nm.

7. The lithographic apparatus of claim 1, wherein the lithographic apparatus further comprises:
   an illumination system configured to condition a radiation beam;
   a projection system configured to project a patterned radiation beam onto a target portion of the substrate; and
   a substrate table constructed to hold a substrate; and
   the monitoring apparatus is operable to measure a parameter of the radiation beam at the substrate table.

8. The lithographic apparatus of claim 1, wherein the lithographic apparatus is an immersion lithographic apparatus and the first sensor apparatus is operable to be in contact with an immersion liquid.

9. The lithographic apparatus of claim 8, wherein the diamond fluorescent material comprises a hydrophobic surface operable to be in contact with the immersion liquid in use.

10. The lithographic apparatus of claim 1, wherein the lithographic apparatus is not an immersion lithographic apparatus, the first sensor apparatus being operable within a dry environment, and wherein the monitoring apparatus comprises a heat sink.

11. The lithographic apparatus of claim 1, wherein the diamond fluorescent material is less than 5 μm thick.

12. The lithographic apparatus of claim 1, wherein the diamond fluorescent material is a monocrystalline synthetic CVD material, an optical grade synthetic poly-CVD diamond, or a thermal grade diamond fluorescent material.

13. A monitoring apparatus configured to monitor first radiation of a first wavelength, wherein the monitoring apparatus comprises:
   a first sensor apparatus comprising a diamond fluorescent material configured to absorb the first radiation and to emit second radiation being representative of the first radiation, the second radiation being of a second wavelength different from the first wavelength; and
   a second sensor apparatus configured to sense the second radiation, the second sensor apparatus configured to determine a dose, intensity and/or energy of the first radiation based on the sensed second radiation.

14. The monitoring apparatus of claim 13, wherein the first wavelength is within the ultraviolet region and/or a region of shorter wavelength.

15. The monitoring apparatus of claim 13, wherein the second wavelength is within the visible region, and/or a region of longer wavelength.

16. The monitoring apparatus of claim 13, wherein the first sensor apparatus comprises a opaque coating presenting an aperture through which the first radiation passes prior to absorption by the diamond fluorescent material or through which the second radiation passes prior to sensing by the second sensor apparatus.

17. The monitoring apparatus of claim 13, wherein the diamond fluorescent material is a diamond fluorescent material doped with nitrogen atoms for detection of first radiation having a wavelength greater than 220 nm.

18. The monitoring apparatus of claim 13, wherein the diamond fluorescent material comprises a hydrophobic surface operable to be in contact with a liquid in use.

19. The monitoring apparatus of claim 13, wherein the diamond fluorescent material is a monocrystalline synthetic CVD material, an optical grade synthetic poly-CVD diamond, or a thermal grade diamond fluorescent material.

20. A monitoring apparatus configured to monitor first radiation of a first wavelength, wherein the monitoring apparatus comprises:
- a first sensor apparatus comprising a diamond fluorescent material configured to absorb the first radiation and to emit second radiation being representative of the first radiation, the second radiation being of a second wavelength different from the first wavelength; and
- a second sensor apparatus configured to sense the second radiation,
- wherein the first sensor apparatus comprises a opaque coating presenting an aperture through which the first radiation passes prior to absorption by the diamond fluorescent material or through which the second radiation passes prior to sensing by the second sensor apparatus.

21. The monitoring apparatus of claim 20, wherein the second sensor apparatus comprises a sensor array operable to measure intensity of the second radiation as a function of position over the length of the aperture.

* * * * *